US012627323B2

(12) United States Patent
Nakamura et al.

(10) Patent No.: US 12,627,323 B2
(45) Date of Patent: May 12, 2026

(54) SIGNAL GENERATION APPARATUS, SIGNAL GENERATION METHOD, AND COMPUTER PROGRAM

(71) Applicant: NTT, Inc., Tokyo (JP)

(72) Inventors: Masanori Nakamura, Musashino (JP);
Hiroshi Yamazaki, Musashino (JP);
Munehiko Nagatani, Musashino (JP);
Fukutaro Hamaoka, Musashino (JP);
Takayuki Kobayashi, Musashino (JP);
Yutaka Miyamoto, Musashino (JP)

(73) Assignee: NTT, Inc., Tokyo (JP)

( * ) Notice: Subject to any disclaimer, the term of this patent is extended or adjusted under 35 U.S.C. 154(b) by 0 days.

(21) Appl. No.: 18/842,555

(22) PCT Filed: Mar. 4, 2022

(86) PCT No.: PCT/JP2022/009445
§ 371 (c)(1),
(2) Date: Aug. 29, 2024

(87) PCT Pub. No.: WO2023/166714
PCT Pub. Date: Sep. 7, 2023

(65) Prior Publication Data
US 2025/0175205 A1 May 29, 2025

(51) Int. Cl.
*H03M 1/66* (2006.01)
*H04B 1/04* (2006.01)
(52) U.S. Cl.
CPC .......... *H04B 1/0475* (2013.01); *H03M 1/662* (2013.01)

(58) Field of Classification Search
CPC ............ H03M 1/06; H03M 1/10; H03M 1/66;
H03M 1/74; H03M 1/662; H04B 1/00;
(Continued)

(56) References Cited

U.S. PATENT DOCUMENTS 8,294,605 B1 * 10/2012 Pagnanelli .............. H03M 3/30
341/145
10,177,780 B2 * 1/2019 Yamazaki ............... H03M 1/66
2021/0320735 A1 10/2021 Yamazaki et al.

FOREIGN PATENT DOCUMENTS

WO WO-2020054173 A1 3/2020

* cited by examiner

*Primary Examiner* — Shawkat M Ali
(74) *Attorney, Agent, or Firm* — Harness, Dickey & Pierce, P.L.C.

(57) ABSTRACT
A signal generation device that includes a digital signal processing unit, a plurality of digital-analog conversion units that respectively converts a plurality of digital signals output from the digital signal processing unit into analog signals, and an analog multiplexer that interleaves the analog signals respectively output from the plurality of digital-analog conversion units to generate a broadband signal, in which the digital signal processing unit includes a serial-parallel conversion unit that divides an input signal into a number according to a ratio between a sampling frequency of the plurality of digital-analog conversion units and a clock frequency of the analog multiplexer in a time domain to generate a plurality of divided signals, and a plurality of convolution arithmetic operation units that receives the plurality of divided signals generated by the serial-parallel conversion unit as inputs and generates a plurality of digital signals corresponding to the respective digital-analog conversion units.

6 Claims, 6 Drawing Sheets

(58) Field of Classification Search
CPC   H04B 1/04; H04B 1/0475; H04B 1/08; H04J
1/00; H04J 1/08; H04J 1/12; H04J 11/00;
H04L 25/02; H04L 27/00; H04L 27/36;
H04L 27/2634
USPC ......................... 341/144; 375/259, 295–297
See application file for complete search history.

- PRIOR ART -

SIGNAL GENERATION APPARATUS, SIGNAL GENERATION METHOD, AND COMPUTER PROGRAM

CROSS-REFERENCE TO RELATED APPLICATIONS

This application is a 371 U.S. National Phase of International Application No. PCT/JP2022/009445, filed on Mar. 4, 2022. The entire disclosure of the above application is incorporated herein by reference.

TECHNICAL FIELD

The present invention relates to a signal generation device, a signal generation method, and a computer program.

BACKGROUND ART

A high-quality high-speed signal generation technology for increasing the capacity of optical transmission has attracted attention. As such a technology, for example, a signal generation device has been proposed, which divides an input signal to be a target into a low frequency and a high frequency and pre-equalizes a divided signal and a complex conjugate signal of the divided signal by multiple input multiple output (MIMO) processing (see, for example, Patent Literature 1).

FIG. 6 is a diagram illustrating a configuration example of a conventional signal generation device 100. The signal generation device 100 includes a band division unit 611, a spectrum folding unit 612, a filter 613, a plurality of sub digital analog converters (DACs) 121 and 122, and an analog multiplexer 131. The band division unit 611 divides an input signal 101 into a low frequency and a high frequency. The spectrum folding unit 612 generates a complex conjugate signal of a divided signal. The filter 613 receives each divided signal and each complex conjugate signal as inputs, and generates a plurality of composite signals to be transmitted to the plurality of SubDACs 121 and 122. The SubDACs 121 and 122 convert the plurality of composite signals output from the filter 613 into a plurality of analog signals. The analog multiplexer 131 receives the plurality of analog signals as inputs and generates a high-speed signal.

CITATION LIST

Patent Literature

Patent Literature 1: WO 2020/054173 A

SUMMARY OF INVENTION

Technical Problem

However, a signal generation method by a conventional signal generation device has a problem of deterioration in signal quality due to an influence of frequency ripples and an increase in peak-to-average power ratio (PAPR) because steep cutout in a frequency domain occurs when dividing an input signal.

In view of the above circumstances, an object of the present invention is to provide a technique capable of generating a broadband signal with high signal quality.

Solution to Problem

One aspect of the present invention is a signal generation device including: a digital signal processing unit; a plurality of digital-analog conversion units that respectively converts a plurality of digital signals output from the digital signal processing unit into analog signals; and an analog multiplexer that interleaves the analog signals respectively output from the plurality of digital-analog conversion units to generate a broadband signal, in which the digital signal processing unit includes a serial-parallel conversion unit that divides an input signal into a number according to a ratio between a sampling frequency of the plurality of digital-analog conversion units and a clock frequency of the analog multiplexer in a time domain to generate a plurality of divided signals, a plurality of convolution arithmetic operation units that performs a convolution arithmetic operation for the plurality of divided signals generated by the serial-parallel conversion unit, and a plurality of addition units that adds the plurality of divided signals for which the convolution arithmetic operation has been performed by the plurality of convolution arithmetic operation units to generate a plurality of digital signals corresponding to the respective digital-analog conversion units.

One aspect of the present invention is a signal generation method including: by a digital signal processing unit, dividing an input signal into a number according to a ratio between a sampling frequency of a plurality of digital-analog conversion units and a clock frequency of an analog multiplexer in a time domain to generate a plurality of divided signals; by the digital signal processing unit, performing a convolution arithmetic operation for the plurality of divided signals; by the digital signal processing unit, adding the plurality of divided signals for which the convolution arithmetic operation has been performed to generate a plurality of digital signals corresponding to the respective digital-analog conversion units; by the plurality of digital-analog conversion units, respectively converting the plurality of digital signals output from the digital signal processing unit into analog signals; and by the analog multiplexer, interleaving the analog signals respectively output from the plurality of digital-analog conversion units to generate a broadband signal.

An aspect of the present invention is a computer program for causing a computer to function as the above-described signal generation device.

Advantageous Effects of Invention

According to the present invention, it is possible to generate a broadband signal with high signal quality.

DESCRIPTION OF EMBODIMENTS

Hereinafter, an embodiment of the present invention will be described with reference to the drawings.

First Embodiment

Figure 1:
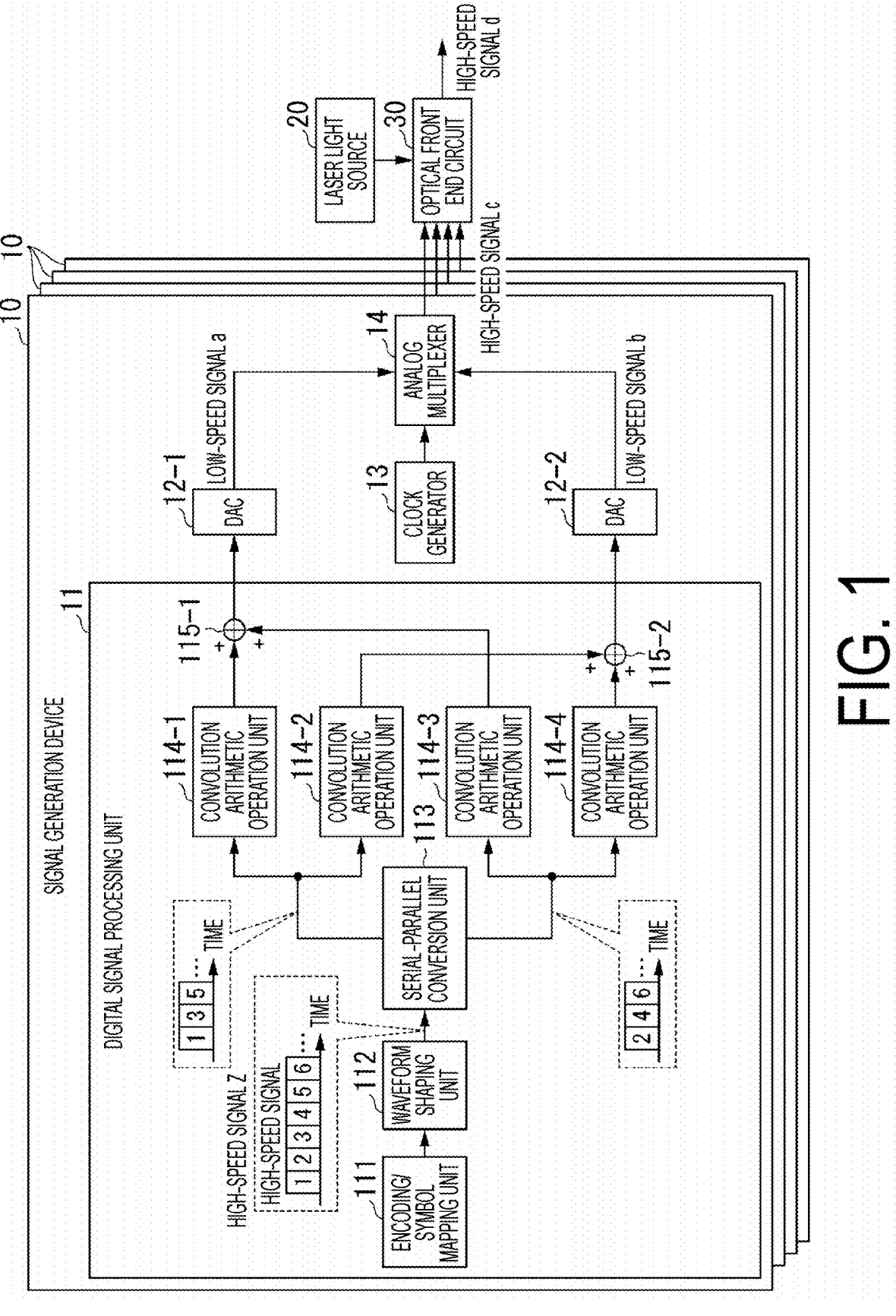
FIG. 1 is a diagram illustrating a configuration example of an optical transmission apparatus including a signal generation device according to a first embodiment.

FIG. 1 is a diagram illustrating a configuration example of an optical transmission apparatus including a signal generation device 10 according to a first embodiment. The optical transmission apparatus includes a plurality of the signal generation devices 10, a laser light source 20, and an optical front end circuit 30. The configurations of the signal generation devices 10 are similar.

The signal generation device 10 generates a signal (high-speed signal c in FIG. 1) having a wider band than an output band of a single DAC, using a plurality of DACs and a high-speed analog device.

The laser light source 20 emits laser light.

The optical front end circuit 30 transmits a modulated signal obtained by modulating the high-speed signal generated by the plurality of signal generation devices 10 with the laser light output from the laser light source 20.

The signal generation device 10 includes a digital signal processing unit (digital signal processor) 11, a plurality of DACs (a plurality of digital-analog converters) 12-1 and 12-2, a clock generator 13, and an analog multiplexer 14. Although the example in FIG. 1 illustrates a case where the number of DACs 12 is two, the present embodiment is applicable to a case where the number of DACs 12 is three or more.

The digital signal processing unit 11 performs digital signal processing for an input signal to generate a digital signal to be sent to each of the DACs 12-1 and 12-2 so as to obtain a desired analog signal as a final output signal $c(t)$ according to characteristics of the analog multiplexer 14.

The DACs 12-1 and 12-2 convert a plurality of the digital signals output from the digital signal processing unit 11 into analog signals, respectively. For example, the DAC 12-1 converts the digital signal output from the digital signal processing unit 11 into an analog signal to generate a low-speed signal $a(t)$, and the DAC 12-2 converts the digital signal output from the digital signal processing unit 11 into an analog signal to generate a low-speed signal $b(t)$.

The clock generator 13 generates a clock for driving the analog multiplexer 14. In the first embodiment, a frequency of the clock generated by the clock generator 13 is assumed to be half a sampling frequency of a high-speed signal c.

The analog multiplexer 14 interleaves the low-speed signals $a(t)$ and $b(t)$ output from the DACs 12-1 and 12-2 to generate a broadband signal. Specific configuration examples of the analog multiplexer 14 include a configuration using an analog multiplexer illustrated in FIG. 2 of Patent Literature 1, a configuration using a mixer and a combiner illustrated in FIG. 3 of Patent Literature 1, and a configuration of an IQ modulator type including a mixer, a combiner, and a 90-degree phase shifter illustrated in FIG. 4 of Patent Literature 1.

In the present example, the configuration using an analog multiplexer will be described as the configuration of the analog multiplexer 14. The analog multiplexer is a switch (selector) circuit that outputs each analog signal output from each DAC 12 while switching the signal at a high speed with a clock having a frequency $f_{clk}$ output from the clock generator 13.

The digital signal processing unit 11 includes an encoding/symbol mapping unit 111, a waveform shaping unit 112, a serial-parallel conversion unit 113, a plurality of convolution arithmetic operation units (a plurality of convolution arithmetic operators) 114-1 to 114-4, and a plurality of addition units (a plurality of adders) 115-1 and 115-2.

The encoding/symbol mapping unit 111 maps a transmission signal obtained by performing forward error correction (FEC) encoding for a transmission bit string to a symbol.

The waveform shaping unit 112 limits the band of the transmission signal.

The serial-parallel conversion unit 113 divides the transmission signal into a number according to a ratio between the sampling frequency of the plurality of DACs 12-1 and 12-2 and the clock frequency $f_{clk}$ of the analog multiplexer 14 in a time domain to generate a plurality of divided signals.

The convolution arithmetic operation units 114-1 to 114-4 perform convolution of a response function for the plurality of divided signals generated by the serial-parallel conversion unit 113. The number of convolution arithmetic operation units 114 varies depending on the number of divisions by the serial-parallel conversion unit 113. For example, as in the first embodiment, in the case where the number of divisions by the serial-parallel conversion unit 113 is 2, the number of convolution arithmetic operation units 114 is $2^N$ (N is the number of divisions).

The addition units 115-1 and 115-2 generates a plurality of digital signals corresponding to the DACs 12-1 and 12-2. The addition unit 115-1 adds the divided signal multiplied by the response function by the convolution arithmetic operation unit 114-1 and the divided signal multiplied by the response function by the convolution arithmetic operation unit 114-3 to generate the digital signal corresponding to the DAC 12-1. The addition unit 115-2 adds the divided signal multiplied by the response function by the convolution arithmetic operation unit 114-2 and the divided signal multiplied by the response function by the convolution arithmetic operation unit 114-4 to generate the digital signal corresponding to the DAC 12-2.

Figure 2:
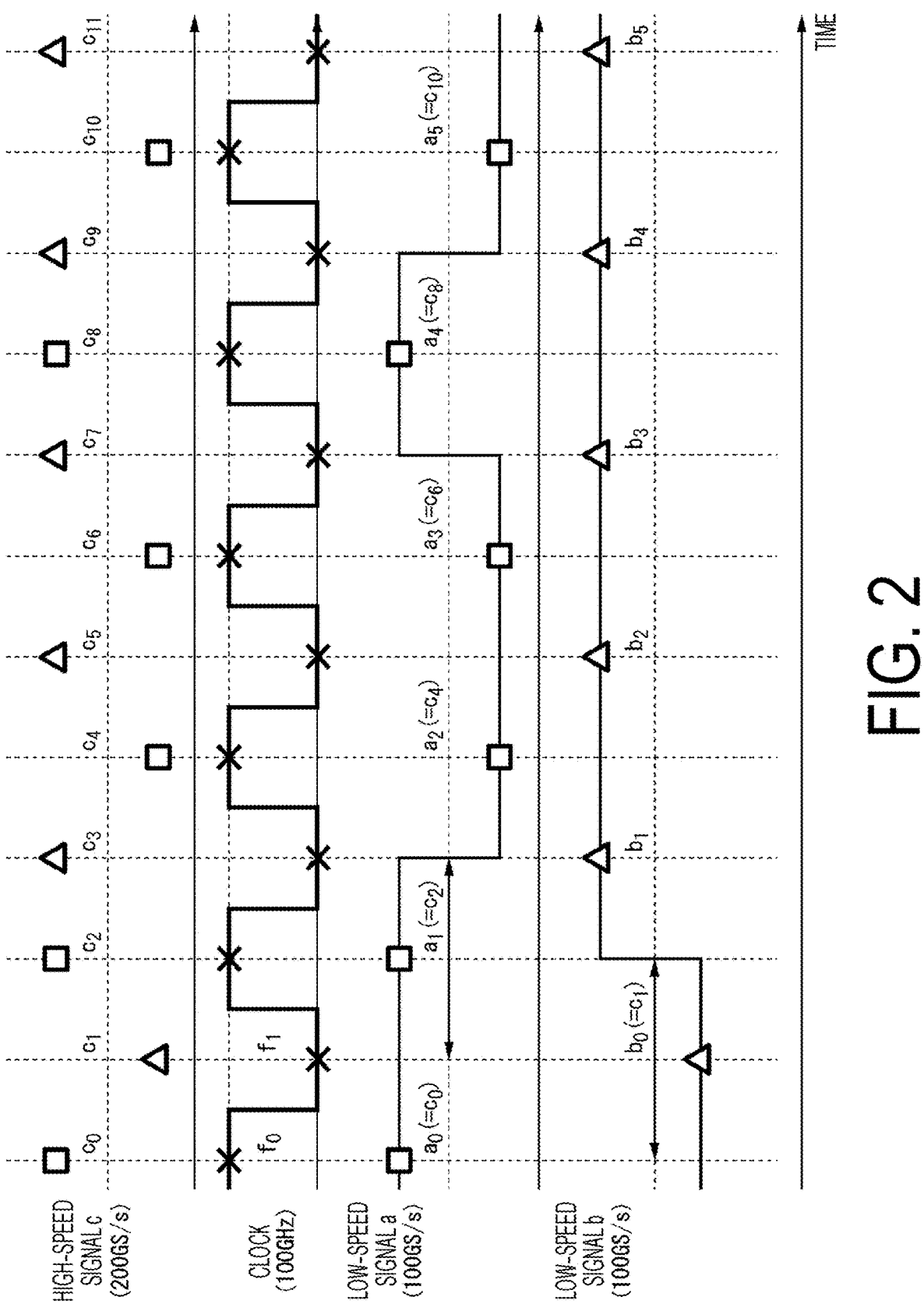
FIG. 2 is a time chart illustrating an operation example of the signal generation device according to the first embodiment.

FIG. 2 is a time chart illustrating an operation example of the signal generation device 10 according to the first embodiment.

The clock illustrated in FIG. 2 is a clock generated by the clock generator 13, a low-speed signal a is a signal output from the DAC 12-1, a low-speed signal b is a signal output from the DAC 12-2, and the high-speed signal c is a signal output from the analog multiplexer 14. In a case where the clock indicates "1", the low-speed signal a is selected, and in a case where the clock indicates "0", the low-speed signal b is selected. Therefore, as indicated by the high-speed signal c, the low-speed signal a is input to the analog multiplexer 14 at timing of $C_0$, $C_2$, $C_4$, $C_6$, $C_8$, and $C_{10}$, and the low-speed signal b is input to the analog multiplexer 14 at timing of $C_1$, $C_3$, $C_5$, $C_7$, $C_9$, and $C_{11}$.

Next, a method of obtaining the response function used for the convolution operation by the convolution arithmetic operation units 114-1 to 114-4 in the first embodiment will be described. The response function in the first embodiment is calculated on the basis of Equations (1) and (2) below.

[Math. 1]

$$\begin{pmatrix} c_{2n} \\ c_{2n+1} \end{pmatrix} = \frac{1}{2} \begin{pmatrix} 1+f_0 & 1-f_0 \\ 1+f_1 & 1-f_1 \end{pmatrix} \begin{pmatrix} h_b & 0 \\ 0 & h_b \end{pmatrix} * \begin{pmatrix} a_n \\ b_n \end{pmatrix} \qquad (1)$$

[Math. 2]

$$\begin{pmatrix} d_{2n} \\ d_{2n+1} \end{pmatrix} = \begin{pmatrix} w_{11} & w_{12} \\ w_{21} & w_{22} \end{pmatrix} * \begin{pmatrix} c_{2n} \\ c_{2n+1} \end{pmatrix} \qquad (2)$$

In Equation (1), a matrix represented by $(1+f_0)$, $(1+f_1)$, $(1-f_0)$, and $(1-f_1)$ is a matrix representing a relationship between the low-speed signals a and b and the clock frequency. The case of $f_0=1$ and $f_1=-1$ corresponds to that illustrated in FIG. 2. Furthermore, in Equation (1), a matrix represented by $h_b$ and 0 is a matrix representing a response of the DAC 12 or the like to the low-speed signals a and b. $a_n$ in Equation (1) is represented by Equation (3), $b_n$ is represented by Equation (4), $C_{2n+1}$ is represented by Equation (5), and $C_{2n+1}$ is represented by Equation (6).

[Math. 3]

$$a_n = \{a_{n-k}, a_{n-k+1}, \dots, a_{n+k}\}^T \qquad (3)$$

[Math. 4]

$$b_n = \{b_{n-k}, b_{n-k+1}, \dots, b_{n+k}\}^T \qquad (4)$$

[Math. 5]

$$C_{2n} = \{C_{2n-2k}, C_{2n-2k+2}, \dots, C_{2n+2k}\}^T \qquad (5)$$

[Math. 6]

$$C_{2n+1} = \{C_{2n-2k+1}, C_{2n-2k+3}, \dots, C_{2n+2k+1}\}^T \qquad (6)$$

In Equation (2), the matrix represented by $w_{11}$, $w_{12}$, $w_{21}$, and $w_{22}$ is a matrix representing a band limitation for a high-speed signal z, and can be obtained by Equation (7).

[Math. 7]

$$d_n = \sum_{-k}^{k} w_m c_{n-m} \qquad (7)$$

Equation (8) can be obtained using Equations (1) and (2) above.

[Math. 8]

$$\begin{pmatrix} d_{2n} \\ d_{2n+1} \end{pmatrix} = \begin{pmatrix} q_{11} & q_{12} \\ q_{21} & q_{22} \end{pmatrix} * \begin{pmatrix} a_n \\ b_n \end{pmatrix} \qquad (8)$$

In Equation (8), the matrix represented by $q_{11}$, $q_{12}$, $q_{21}$, and $q_{22}$ is a matrix representing a system response at or after the DAC 12. By transforming Equation (8) into Equation (9), the response functions of the convolution arithmetic operation units 114-1 to 114-4 can be obtained.

[Math. 9]

$$\begin{pmatrix} a_n \\ b_n \end{pmatrix} = \begin{pmatrix} q_{11} & q_{12} \\ q_{21} & q_{22} \end{pmatrix}^{-1} * \begin{pmatrix} z_{2n} \\ z_{2n+1} \end{pmatrix} \qquad (9)$$

Specifically, the inverse matrix represented by $q_{11}$, $q_{12}$, $q_{21}$, and $q_{22}$ in Equation (9) represents the response functions of the convolution arithmetic operation units 114-1 to 114-4. In Equation (9), the matrix represented by $z_{2n}$ and $z_{2n+}$ represents a desired high-speed signal.

Next, the operation of the signal generation device 10 will be described with reference to FIG. 1. The transmission bit string input to the signal generation device 10 is mapped to a symbol after FEC encoding is performed by the encoding/symbol mapping unit 111. The waveform shaping unit 112 limits the band of the transmission signal mapped to the symbol by the encoding/symbol mapping unit 111.

As illustrated in FIG. 1, the high-speed signal z (1, 2, 3, 4, 5, 6, ... ) is input to the serial-parallel conversion unit 113. The serial-parallel conversion unit 113 divides the input high-speed signal z into the number according to the ratio between the sampling frequency of the plurality of DACs 12-1 and 12-2 and the clock frequency $f_{clk}$ of the analog multiplexer 14 in the time domain to generate a plurality of divided signals. Here, in the first embodiment, the clock frequency $f_{clk}$ is half the sampling frequency of the high-speed signal c. Therefore, the serial-parallel conversion unit 113 generates two divided signals by dividing the input high-speed signal z into two signals.

For example, the serial-parallel conversion unit 113 generates a first divided signal (a signal denoted by 1, 3, 5, . . . in FIG. 1) and a second divided signal (a signal denoted by 2, 4, 6, . . . in FIG. 1) by dividing the input high-speed signal z into two signals. The serial-parallel conversion unit 113 outputs the first divided signal to the convolution arithmetic operation units 114-1 and 114-2, and outputs the second divided signal to the convolution arithmetic operation units 114-3 and 114-4.

Each convolution arithmetic operation unit 114 performs a convolution arithmetic operation by multiplying the input divided signal (for example, the first divided signal and the second divided signal) by the response function obtained by the above-described method. For example, the convolution arithmetic operation units 114-1 and 114-2 perform the convolution arithmetic operation by multiplying the first divided signal by the response function obtained by the above-described method. For example, the convolution arithmetic operation units 114-3 and 114-4 perform the convolution arithmetic operation by multiplying the second divided signal by the response function obtained by the above-described method.

The addition unit 115-1 adds the first divided signal multiplied by the predetermined response function by the convolution arithmetic operation unit 114-1 and the second divided signal multiplied by the predetermined response function by the convolution arithmetic operation unit 114-3 to generate a digital signal. The addition unit 115-1 outputs the generated digital signal to the DAC 12-1.

The addition unit 115-2 adds the first divided signal multiplied by the predetermined response function by the convolution arithmetic operation unit 114-2 and the second divided signal multiplied by the predetermined response function by the convolution arithmetic operation unit 114-4 to generate a digital signal. The addition unit 115-1 outputs the generated digital signal to the DAC 12-2.

The DAC 12-1 samples the digital signal output from the addition unit 115-1 at a set sampling frequency and converts the digital signal into an analog signal. As a result, the low-speed signal a is generated. The DAC 12-2 samples the digital signal output from the addition unit 115-2 at a set sampling frequency and converts the digital signal into an analog signal. As a result, the low-speed signal b is generated. The analog multiplexer 14 generates the high-speed signal c using the low-speed signal a generated by the DAC 12-1 and the low-speed signal b generated by the DAC 12-2.

According to the signal generation device 10 configured as described above, the digital signal processing unit 11 divides the input signal into the number according to the ratio between the sampling frequency of the plurality of DACs 12 and the clock frequency of the analog multiplexer 14 in the time domain to generate the plurality of divided signals, and generates the plurality of digital signals corresponding to the respective DACs 12 on the basis of the plurality of divided signals. As described above, by the time domain division and the real number MIMO processing, it is possible to compensate for device imperfections that are a problem at the time of generating a high-speed signal while suppressing the influence of frequency ripples due to steep filtering and an increase in PAPR. Therefore, combining of broadband signals with high signal quality is achieved.

Second Embodiment

In a second embodiment, a case where a frequency of a clock generated by a clock generator 13 is $1/4$ of a sampling frequency of a high-speed signal c will be described.

Figure 3:
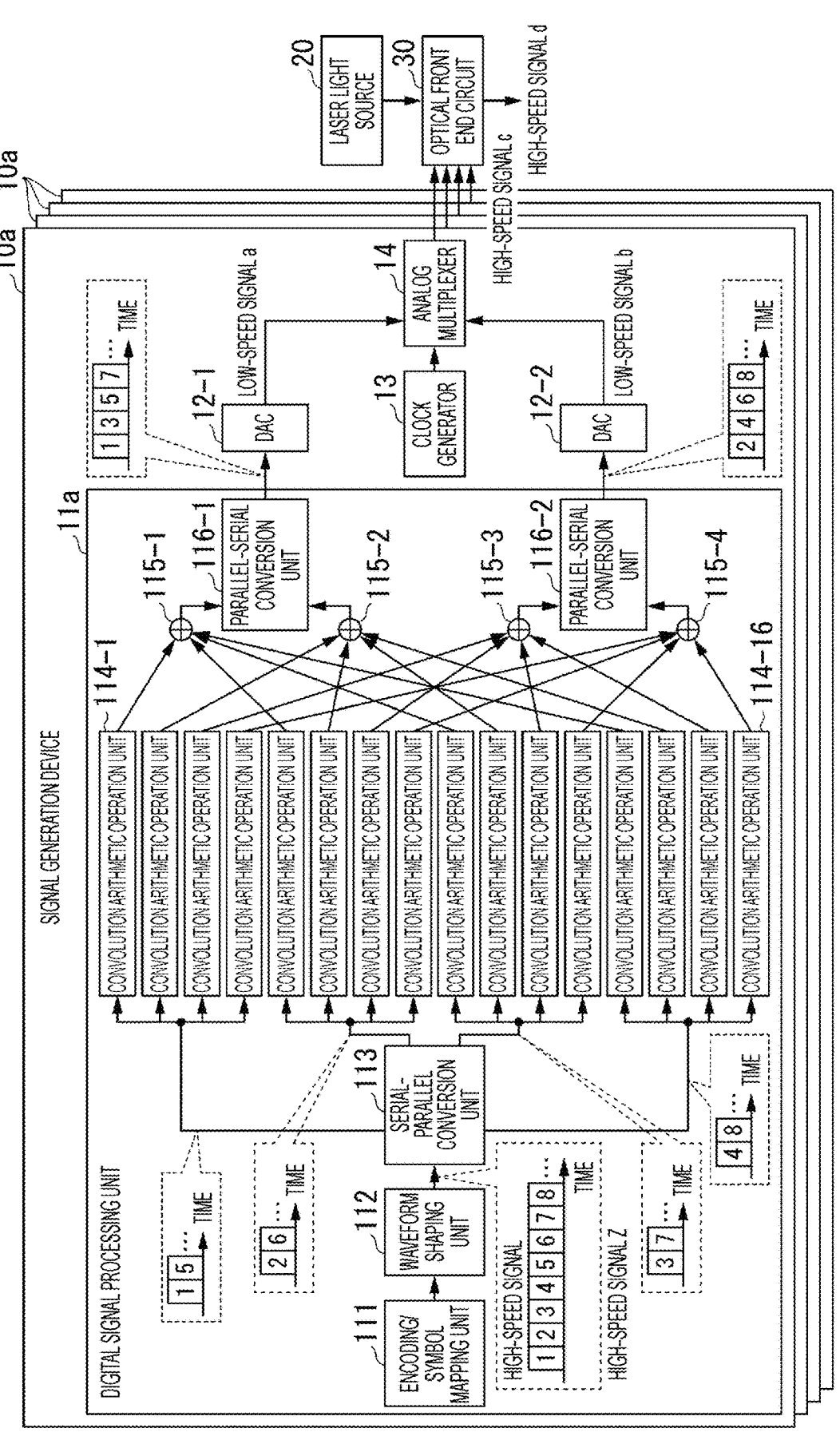
FIG. 3 is a diagram illustrating a configuration example of an optical transmission apparatus including a signal generation device according to a second embodiment.

FIG. 3 is a diagram illustrating a configuration example of an optical transmission apparatus including a signal generation device 10a according to the second embodiment. The optical transmission apparatus includes a plurality of the signal generation devices 10a, a laser light source 20, and an optical front end circuit 30. The configurations of the signal generation devices 10a are similar.

The second embodiment is different from the first embodiment in that the configuration of the signal generation device 10a is different. Therefore, the configuration of the signal generation device 10a will be mainly described. The signal generation device 10a includes a digital signal processing unit 11a, a plurality of DACs 12-1 and 12-2, a clock generator 13, and an analog multiplexer 14. The digital signal processing unit 11a includes an encoding/symbol mapping unit 111, a waveform shaping unit 112, a serial-parallel conversion unit 113a, a plurality of convolution arithmetic operation units 114-1 to 114-16, a plurality of addition units 115-1 to 115-4, and parallel-serial conversion units (parallel-serial converters) 116-1 and 116-2

Note that, in FIG. 3, signs are not assigned to all the convolution arithmetic operation units 114 for convenience of the drawing, but branch numbers from 2 to 16 are assigned to the respective convolution arithmetic operation units in order from the convolution arithmetic operation unit 114-1.

The serial-parallel conversion unit 113a divides a transmission signal into a number according to a ratio between a sampling frequency of the plurality of DACs 12-1 and 12-2 and a clock frequency $f_{clk}$ of the analog multiplexer 14 in a time domain to generate a plurality of divided signals, similarly to the first embodiment. In the second embodiment, the ratio between the sampling frequency of the plurality of DACs 12-1 and 12-2 and the clock frequency $f_{clk}$ of the analog multiplexer 14 is different from that in the first embodiment. Therefore, the number of divisions by the serial-parallel conversion unit 113a is different from that in the first embodiment.

The parallel-serial conversion unit 116-1 performs parallel-serial conversion for a digital signal output from the addition unit 115-1 and a digital signal output from the addition unit 115-2.

The parallel-serial conversion unit 116-2 performs parallel-serial conversion for a digital signal output from the addition unit 115-3 and a digital signal output from the addition unit 115-4.

Figure 4:
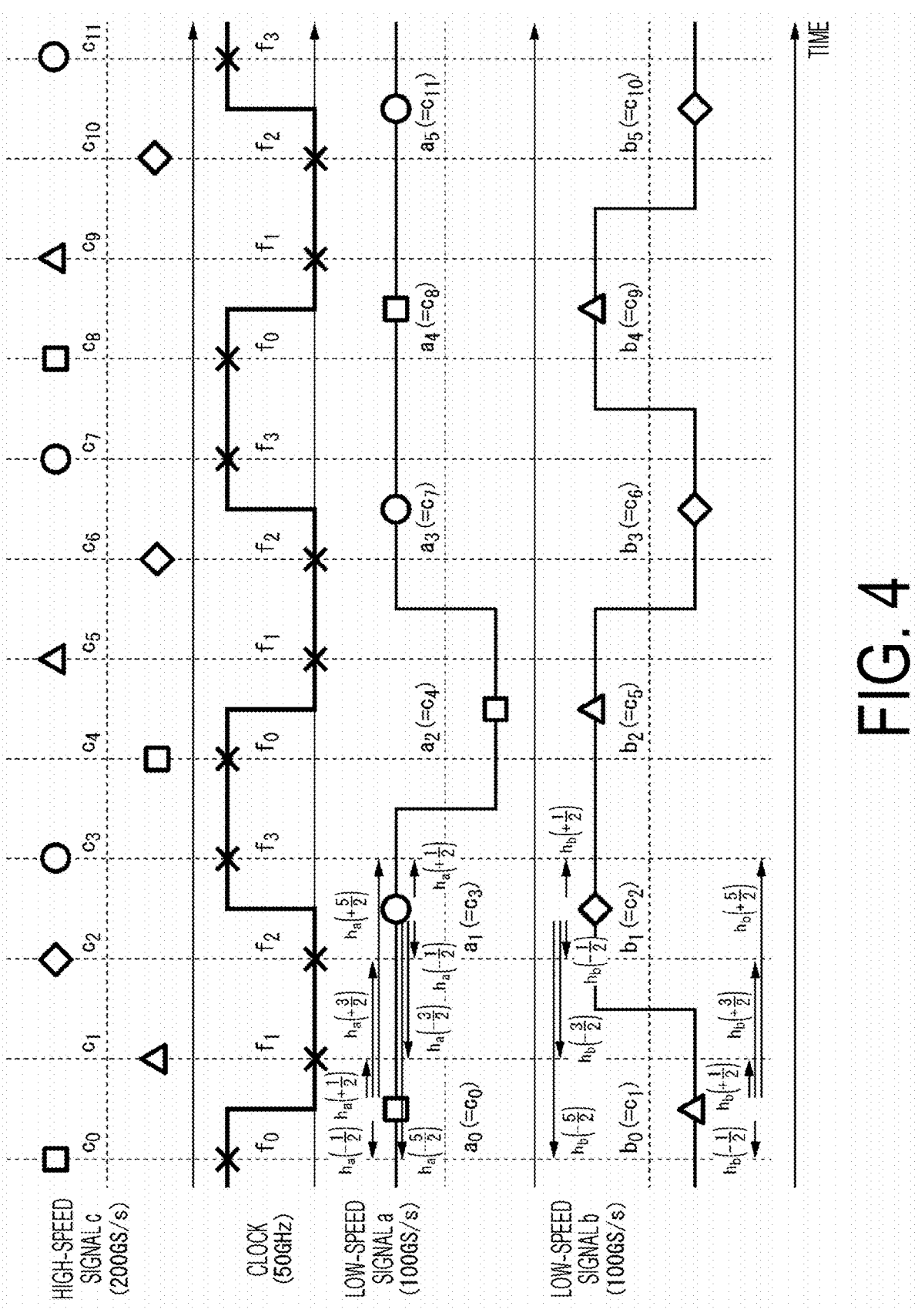
FIG. 4 is a time chart illustrating an operation example of the signal generation device according to the second embodiment.

FIG. 4 is a time chart illustrating an operation example of the signal generation device 10a according to the second embodiment.

The clock illustrated in FIG. 4 is a clock generated by the clock generator 13, a low-speed signal a is a signal output from the DAC 12-1, a low-speed signal b is a signal output from the DAC 12-2, and the high-speed signal c is a signal output from the analog multiplexer 14. In a case where the clock indicates "1", the low-speed signal a is selected, and in a case where the clock indicates "0", the low-speed signal b is selected. The cross marks illustrated in the low-speed signal a and the low-speed signal b represent signals that are actually selected. The numbers (for example, $h_a(\pm 1/2)$, $h_a(\pm 3/2)$, $h_a(\pm 5/2)$, $h_b(\pm 1/2)$, $h_b(\pm 3/2)$, and $h_b(\pm 5/2)$) illustrated in the low-speed signal a and the low-speed signal b represent components of when the cross marks illustrated in the low-speed signal a and the low-speed signal b contribute to the high-speed signal c.

Next, a method of obtaining a response function used for the convolution operation by the convolution arithmetic operation units 114-1 to 114-6 in the second embodiment will be described. The response function in the second embodiment is calculated on the basis of Equations (10) and (11) below.

[Math. 10]

$$
\begin{pmatrix} c_{4n} \\ c_{4n+1} \\ c_{4n+2} \\ c_{4n+3} \end{pmatrix} = 
$$

$$
\begin{pmatrix} (1+f_0)h_a\left(-\frac{1}{2}\right) & (1-f_0)h_b\left(-\frac{1}{2}\right) & (1+f_0)h_a\left(-\frac{5}{2}\right) & (1-f_0)h_b\left(-\frac{5}{2}\right) \\ (1+f_1)h_a\left(+\frac{1}{2}\right) & (1-f_1)h_b\left(+\frac{1}{2}\right) & (1+f_1)h_a\left(-\frac{3}{2}\right) & (1-f_1)h_b\left(-\frac{3}{2}\right) \\ (1+f_2)h_a\left(+\frac{3}{2}\right) & (1-f_2)h_b\left(+\frac{3}{2}\right) & (1+f_2)h_a\left(-\frac{1}{2}\right) & (1-f_2)h_b\left(-\frac{1}{2}\right) \\ (1+f_3)h_a\left(+\frac{5}{2}\right) & (1-f_3)h_b\left(+\frac{5}{2}\right) & (1+f_3)h_a\left(+\frac{1}{2}\right) & (1-f_3)h_b\left(+\frac{1}{2}\right) \end{pmatrix} *
$$

$$
\begin{pmatrix} a_{2n} \\ b_{2n} \\ a_{2n+1} \\ b_{2n+1} \end{pmatrix}
$$

(10)

[Math. 11]

$$
\begin{pmatrix} d_{4n} \\ d_{4n+1} \\ d_{4n+2} \\ d_{4n+3} \end{pmatrix} = \begin{pmatrix} w_{11} & w_{12} & w_{13} & w_{14} \\ w_{21} & w_{22} & w_{23} & w_{24} \\ w_{31} & w_{32} & w_{33} & w_{34} \\ w_{41} & w_{42} & w_{43} & w_{44} \end{pmatrix} * \begin{pmatrix} c_{4n} \\ c_{4n+1} \\ c_{4n+2} \\ c_{4n+3} \end{pmatrix}
$$

(11)

In Equation (10), the left matrix on the right side is a matrix in consideration of a relationship between the low-speed signals a and b and clock waveforms $f_0$, $f_1$, $f_2$, and $f_3$ at clock phases 0, 1, 2, and 3 and a transition of an analog waveform caused by responses $h_a$ and $h_b$ to the low-speed signals a and b (the numbers in parentheses are times from a sampling point of the low-speed signal).

In Equation (11), the left matrix on the right side is a matrix representing a band limitation for a high-speed signal z, and can be obtained by Equation (7) above.

Equation (12) can be obtained using Equations (10) and (11) above.

[Math. 12]

$$\begin{pmatrix} d_{4n} \\ d_{4n+1} \\ d_{4n+2} \\ d_{4n+3} \end{pmatrix} = \begin{pmatrix} q_{11} & q_{12} & q_{13} & q_{14} \\ q_{21} & q_{22} & q_{23} & q_{24} \\ q_{31} & q_{32} & q_{33} & q_{34} \\ q_{41} & q_{42} & q_{43} & q_{44} \end{pmatrix} * \begin{pmatrix} a_{2n} \\ b_{2n} \\ a_{2n+1} \\ b_{2n+1} \end{pmatrix} \quad (12)$$

In Equation (12), the left matrix on the right side is a matrix representing a system response at and after the DAC 12. By transforming Equation (12) into Equation (13), the response functions of the convolution arithmetic operation units 114-1 to 114-16 can be obtained.

[Math. 13]

$$\begin{pmatrix} a_{2n} \\ b_{2n} \\ a_{2n+1} \\ b_{2n+1} \end{pmatrix} = \begin{pmatrix} q_{11} & q_{12} & q_{13} & q_{14} \\ q_{21} & q_{22} & q_{23} & q_{24} \\ q_{31} & q_{32} & q_{33} & q_{34} \\ q_{41} & q_{42} & q_{43} & q_{44} \end{pmatrix}^{-1} * \begin{pmatrix} z_{4n} \\ z_{4n+1} \\ z_{4n+2} \\ z_{4n+3} \end{pmatrix} \quad (13)$$

Specifically, the inverse matrix represented by the left matrix on right side in Equation (13) represents the response functions of the convolution arithmetic operation units 114-1 to 114-16. In Equation (12), the matrix represented by $z_{4n}$, $z_{4n+1}$, $z_{4n+2}$, and $z_{4n+}3$ represents a desired high-speed signal.

Next, an operation of the signal generation device 10a will be described with reference to FIG. 3. A transmission bit string input to the signal generation device 10a is mapped to a symbol after FEC encoding is performed by the encoding/symbol mapping unit 111. The waveform shaping unit 112 limits the band of the transmission signal mapped to the symbol by the encoding/symbol mapping unit 111.

As illustrated in FIG. 3, the high-speed signal z (1, 2, 3, 4, 5, 6, 7, 8, . . . ) is input to the serial-parallel conversion unit 113a. The serial-parallel conversion unit 113a divides the input high-speed signal z into the number according to the ratio between the sampling frequency of the plurality of DACs 12-1 and 12-2 and the clock frequency $f_{clk}$ of the analog multiplexer 14 in the time domain to generate a plurality of divided signals. Here, in the second embodiment, the clock frequency $f_{clk}$ is ¼ of the sampling frequency of the high-speed signal c. Therefore, the serial-parallel conversion unit 113a generates four divided signals by dividing the input high-speed signal z into four signals.

For example, the serial-parallel conversion unit 113a divides the input high-speed signal z into four signals to generate a first divided signal (a signal indicated by a number (1, 5, . . . ) of 4k+1 (k is a number equal to or greater than 0) in FIG. 3), a second divided signal (a signal indicated by a number (2, 6, . . . ) of 4k+2 in FIG. 3), a third divided signal (a signal indicated by a number (3, 7, . . . ) of 4k+3 in FIG. 3), and a fourth divided signal (a signal indicated by a number (4, 8, . . . ) of 4k+4 in FIG. 3).

The serial-parallel conversion unit 113a outputs the first divided signal to the convolution arithmetic operation units 114-1 to 114-4, outputs the second divided signal to the convolution arithmetic operation units 114-5 to 114-8, outputs the third divided signal to the convolution arithmetic operation units 114-9 to 114-11, and outputs the fourth divided signal to the convolution arithmetic operation units 114-12 to 114-16.

Each convolution arithmetic operation unit 114 performs a convolution arithmetic operation by multiplying the input divided signal (the first divided signal to the fourth divided signal) by the response function obtained by the above-described method. For example, the convolution arithmetic operation units 114-1 and 114-4 perform the convolution arithmetic operation by multiplying the first divided signal by the response function obtained by the above-described method. For example, the convolution arithmetic operation units 114-5 and 114-8 perform the convolution arithmetic operation by multiplying the second divided signal by the response function obtained by the above-described method. For example, the convolution arithmetic operation units 114-9 and 114-12 perform the convolution arithmetic operation by English Translation of multiplying the third divided signal by the response function obtained by the above-described method. For example, the convolution arithmetic operation units 114-13 and 114-16 perform the convolution arithmetic operation by multiplying the fourth divided signal by the response function obtained by the above-described method.

The addition unit 115-1 adds the first divided signal multiplied by the predetermined response function by the convolution arithmetic operation unit 114-1, the second divided signal multiplied by the predetermined response function by the convolution arithmetic operation unit 114-5, the third divided signal multiplied by the predetermined response function by the convolution arithmetic operation unit 114-9, and the fourth divided signal multiplied by the predetermined response function by the convolution arithmetic operation unit 114-13 to generate a digital signal. The addition unit 115-1 outputs the generated digital signal to the parallel-serial conversion unit 116-1.

The addition unit 115-2 adds the first divided signal multiplied by the predetermined response function by the convolution arithmetic operation unit 114-2, the second divided signal multiplied by the predetermined response function by the convolution arithmetic operation unit 114-6, the third divided signal multiplied by the predetermined response function by the convolution arithmetic operation unit 114-10, and the fourth divided signal multiplied by the predetermined response function by the convolution arithmetic operation unit 114-14 to generate a digital signal. The addition unit 115-2 outputs the generated digital signal to the parallel-serial conversion unit 116-1.

The addition unit 115-3 adds the first divided signal multiplied by the predetermined response function by the convolution arithmetic operation unit 114-3, the second divided signal multiplied by the predetermined response function by the convolution arithmetic operation unit 114-7, the third divided signal multiplied by the predetermined response function by the convolution arithmetic operation unit 114-11, and the fourth divided signal multiplied by the predetermined response function by the convolution arithmetic operation unit 114-15 to generate a digital signal. The addition unit 115-3 outputs the generated digital signal to the parallel-serial conversion unit 116-2.

The addition unit 115-4 adds the first divided signal multiplied by the predetermined response function by the convolution arithmetic operation unit 114-4, the second divided signal multiplied by the predetermined response function by the convolution arithmetic operation unit 114-8, the third divided signal multiplied by the predetermined response function by the convolution arithmetic operation unit 114-12, and the fourth divided signal multiplied by the predetermined response function by the convolution arithmetic operation unit 114-16 to generate a digital signal. The addition unit 115-4 outputs the generated digital signal to the parallel-serial conversion unit 116-2.

The parallel-serial conversion unit 116-1 performs parallel-serial conversion for a digital signal output from the addition unit 115-1 and a digital signal output from the addition unit 115-2. As a result, the parallel-serial conversion unit 116-1 outputs the digital signal (for example, the signal indicated by 1, 3, 5, 7, . . . in FIG. 3) after the parallel-serial conversion to the analog multiplexer 14.

The parallel-serial conversion unit 116-2 performs parallel-serial conversion for a digital signal output from the addition unit 115-3 and a digital signal output from the addition unit 115-4. As a result, the parallel-serial conversion unit 116-2 outputs the digital signal (for example, the signal indicated by 2, 4, 6, 8, . . . in FIG. 3) after the parallel-serial conversion to the analog multiplexer 14.

The DAC 12-1 samples the digital signal output from the parallel-serial conversion unit 116-1 at a set sampling frequency and converts the digital signal into an analog signal. As a result, the low-speed signal a is generated. The DAC 12-2 samples the digital signal output from the parallel-serial conversion unit 116-2 at a set sampling frequency and converts the digital signal into an analog signal. As a result, the low-speed signal b is generated. The analog multiplexer 14 generates the high-speed signal c using the low-speed signal a generated by the DAC 12-1 and the low-speed signal b generated by the DAC 12-2.

According to the signal generation device 10a configured as described above, even in the case where the ratio between the frequency of the clock generated by the clock generator 13 and the sampling frequency of the high-speed signal z is ¼, effects similar to those of the first embodiment can be obtained.

Third Embodiment

In a third embodiment, a case where a frequency of a clock generated by a clock generator 13 is ⅙ of a sampling frequency of a high-speed signal c will be described.

Figure 5:
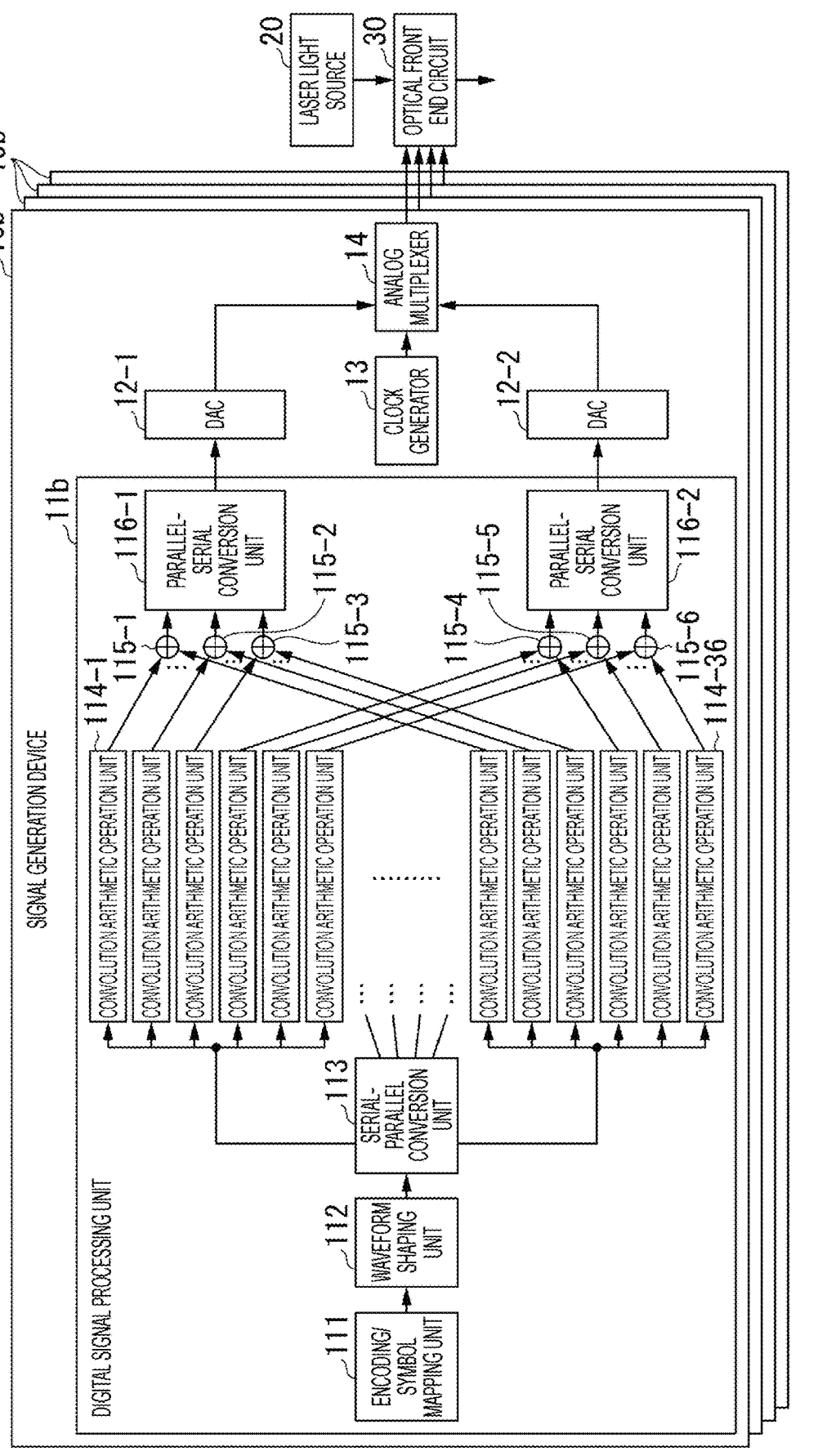
FIG. 5 is a diagram illustrating a configuration example of the optical transmission apparatus including the signal generation device according to the second embodiment.
Figure 6:
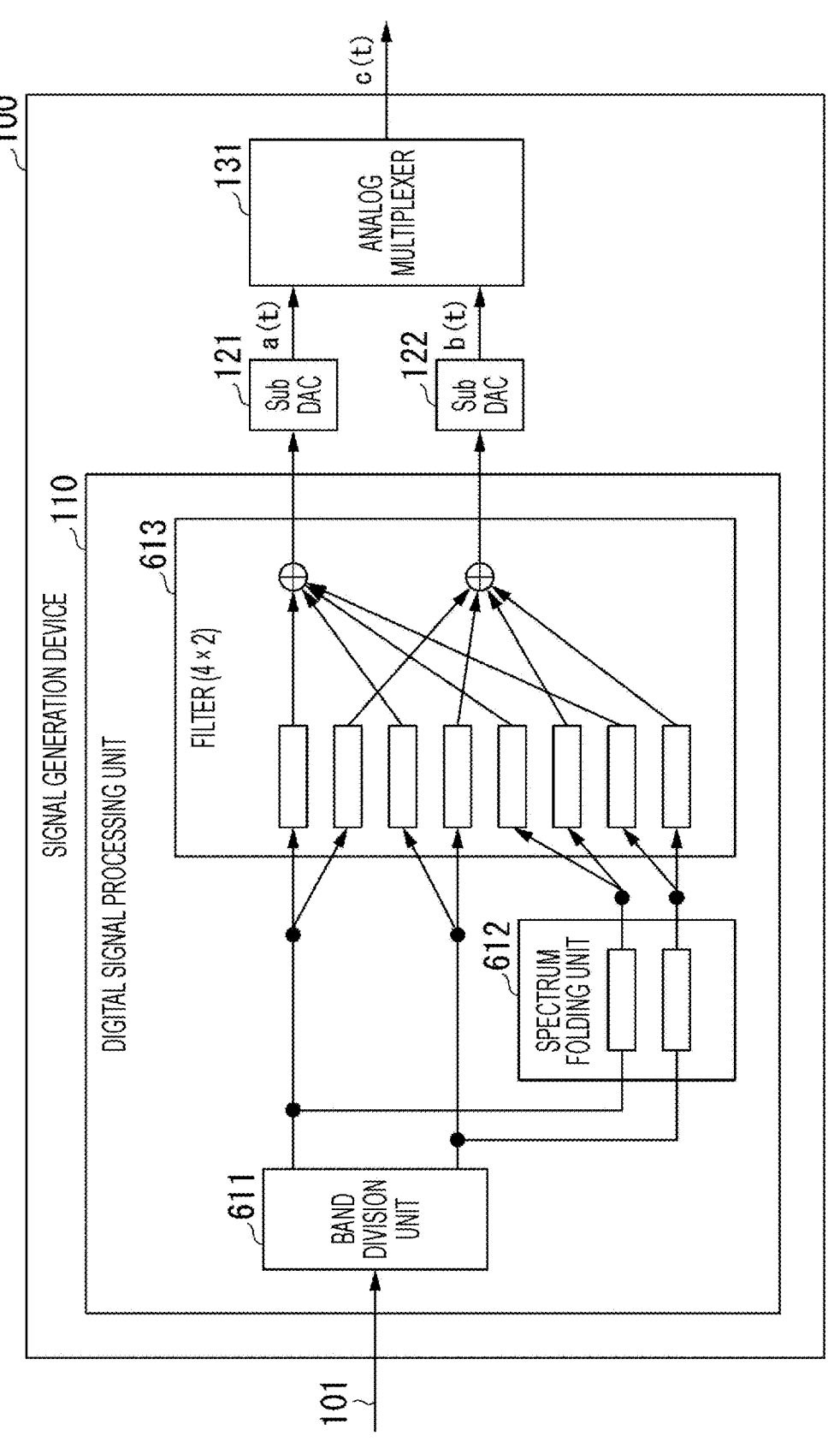
FIG. 6 is a diagram illustrating a configuration example of a conventional signal generation device.

FIG. 5 is a diagram illustrating a configuration example of an optical transmission apparatus including a signal generation device 10b according to the third embodiment. The optical transmission apparatus includes a plurality of the signal generation devices 10b, a laser light source 20, and an optical front end circuit 30. The configurations of the signal generation devices 10b are similar.

The third embodiment is different from the first embodiment in that the configuration of the signal generation device 10b is different. Therefore, the configuration of the signal generation device 10b will be mainly described. The signal generation device 10b includes a digital signal processing unit 11b, a plurality of DACs 12-1 and 12-2, a clock generator 13, and an analog multiplexer 14. The digital signal processing unit 11b includes an encoding/symbol mapping unit 111, a waveform shaping unit 112, a serial-parallel conversion unit 113b, a plurality of convolution arithmetic operation units 114-1 to 114-36, a plurality of addition units 115-1 to 115-6, and a parallel-serial conversion unit 116-1 and 116-2

Note that, in FIG. 5, signs are not assigned to all the convolution arithmetic operation units 114 for convenience of the drawing, but branch numbers from 2 to 36 are assigned to the respective convolution arithmetic operation units in order from the convolution arithmetic operation unit 114-1.

The serial-parallel conversion unit 113b divides a transmission signal into a number according to a ratio between a sampling frequency of the plurality of DACs 12-1 and 12-2 and a clock frequency $f_{clk}$ of the analog multiplexer 14 in a time domain to generate a plurality of divided signals, similarly to the first embodiment. In the third embodiment, the ratio between the sampling frequency of the plurality of DACs 12-1 and 12-2 and the clock frequency $f_{clk}$ of the analog multiplexer 14 is different from that in the first embodiment. Therefore, the number of divisions by the serial-parallel conversion unit 113b is different from that in the first embodiment.

Next, an operation of the signal generation device 10b will be described with reference to FIG. 5. A transmission bit string input to the signal generation device 10b is mapped to a symbol after FEC encoding is performed by the encoding/symbol mapping unit 111. The waveform shaping unit 112 limits the band of the transmission signal mapped to the symbol by the encoding/symbol mapping unit 111.

A high-speed signal z is input to the serial-parallel conversion unit 113b. The serial-parallel conversion unit 113b divides the input high-speed signal z into a number according to the ratio between the sampling frequency of the plurality of DACs 12-1 and 12-2 and the clock frequency $f_{clk}$ of the analog multiplexer 14 in a time domain to generate a plurality of divided signals. Here, in the third embodiment, the clock frequency $f_{clk}$ is ⅙ of the sampling frequency of the high-speed signal z. Therefore, the serial-parallel conversion unit 113b generates six divided signals by dividing the input high-speed signal z into six signals.

For example, the serial-parallel conversion unit 113b divides the input high-speed signal z into six signals to generate a first divided signal (for example, a signal indicated by a number (1, 7, . . . ) of 6k+1), a second divided signal (for example, a signal indicated by a number (2, 8, . . . ) of 6k+2), a third divided signal (for example, a signal indicated by a number (3, 9, . . . ) of 6k+3), a fourth divided signal (for example, a signal indicated by a number (4, 10, . . . ) of 6k+4), a fifth divided signal (for example, a signal indicated by a number (5, 11, . . . ) of 6k+5), and a sixth divided signal (for example, a signal indicated by a number (6, 12, . . . ) of 6k+6).

The serial-parallel conversion unit 113b outputs the first divided signal to the convolution arithmetic operation units 114-1 to 114-6, outputs the second divided signal to the convolution arithmetic operation units 114-7 to 114-12, outputs the third divided signal to the convolution arithmetic operation units 114-13 to 114-18, outputs the fourth divided signal to the convolution arithmetic operation units 114-19 to 114-24, outputs the fifth divided signal to the convolution arithmetic operation units 114-25 to 114-30, and outputs the sixth divided signal to the convolution arithmetic operation units 114-31 to 114-36.

Each convolution arithmetic operation unit 114 performs a convolution arithmetic operation by multiplying the input divided signal (the first divided signal to the sixth divided signal) by the response function obtained. For example, the addition unit 115-1 adds the first divided signal multiplied by the predetermined response function by the convolution arithmetic operation unit 114-1, the second divided signal multiplied by the predetermined response function by the convolution arithmetic operation unit 114-7, the third divided signal multiplied by the predetermined response function by the convolution arithmetic operation unit 114-13, the fourth divided signal multiplied by the predetermined response function by the convolution arithmetic operation unit 114-19, the fifth divided signal multiplied by the predetermined response function by the convolution arithmetic operation unit 114-25, and the sixth divided signal multiplied by the predetermined response function by the convolution arithmetic operation unit 114-31 to generate a digital signal. The addition unit 115-1 outputs the generated digital signal to the parallel-serial conversion unit 116-1.

The addition units 115-2 to 115-6 also perform processing similar to the addition unit 115-1 to generate digital signals. The addition units 115-2 and 115-3 output the generated digital signals to the parallel-serial conversion unit 116-1. The addition units 115-4 to 115-6 output the generated digital signals to the parallel-serial conversion unit 116-2.

The parallel-serial conversion unit 116-1 performs parallel-serial conversion for the digital signal output from the addition unit 115-1, the digital signal output from the addition unit 115-2, and the digital signal output from the addition unit 115-3. As a result, the digital signal (the signal indicated by 1, 3, 5, . . . ) indicated by an odd number is output from the parallel-serial conversion unit 116-1.

The parallel-serial conversion unit 116-2 performs parallel-serial conversion for the digital signal output from the addition unit 115-4, the digital signal output from the addition unit 115-5, and the digital signal output from the addition unit 115-6. As a result, the digital signal (the signal indicated by 2, 4, 6, . . . ) indicated by an odd number is output from the parallel-serial conversion unit 116-2.

The DAC 12-1 samples the digital signal output from the parallel-serial conversion unit 116-1 at a set sampling frequency and converts the digital signal into an analog signal. As a result, the low-speed signal a is generated. The DAC 12-2 samples the digital signal output from the parallel-serial conversion unit 116-2 at a set sampling frequency and converts the digital signal into an analog signal. As a result, the low-speed signal b is generated. The analog multiplexer 14 generates the high-speed signal c using the low-speed signal a generated by the DAC 12-1 and the low-speed signal b generated by the DAC 12-2.

According to the signal generation device 10b configured as described above, even in the case where the ratio between the frequency of the clock generated by the clock generator 13 and the sampling frequency of the high-speed signal z is ⅙, effects similar to those of the first embodiment can be obtained.

Other Configurations

The above-described embodiments illustrate the configurations in which the serial-parallel conversion units 113, 113a and 113b divide the high-speed signal z into two signals, four signals, and six signals. In a case where the ratio between the frequency of the clock generated by the clock generator 13 and the sampling frequency of the high-speed signal z is ½M (M is an integer of 1 or more) such as ⅛ or ⅒, the serial-parallel conversion unit 113 can also divide the high-speed signal z into 2M signals such as 8 signals and 10 signals. In such a configuration, the number of convolution arithmetic operation units 114 increases according to the number of divisions of the high-speed signal z. For example, in a case where the number of divisions of the high-speed signal z is 8, the number of convolution arithmetic operation units 114 is $2^8$.

Some functional units of the signal generation devices 10, 10a, and 10b in the above-described embodiments may be implemented by a computer. In this case, a program for implementing this function may be recorded in a computer-readable recording medium, and the program recorded in the recording medium may be read and executed by a computer system to implement the function. Note that, the "computer system" herein includes an OS and hardware such as peripheral devices.

The "computer-readable recording medium" refers to a portable medium such as a flexible disk, a magneto-optical disk, a read only memory (ROM), or a CD-ROM, or a storage device such as a hard disk included in a computer system, for example. Moreover, the "computer-readable recording medium" may include a medium that dynamically holds the program for a short time, such as a communication line in a case where the program is transmitted via a network such as the Internet or a communication line such as a telephone line, and a medium that holds the program for a certain period of time, such as a volatile memory inside a computer system serving as a server or a client in that case. The above-described program may be for implementing some of the functions described above, may be implemented by a combination of the functions described above and a program already recorded in a computer system, or may be implemented with a programmable logic device such as a field-programmable gate array (FPGA).

Although the embodiments of the present invention have been described in detail with reference to the drawings, the specific configuration is not limited to the embodiments, and includes design and the like without departing from the gist of the present invention.

INDUSTRIAL APPLICABILITY

The present invention can be applied to a technique for generating a high-speed signal.

REFERENCE SIGNS LIST

10, 10a, 10b Signal generation device
11, 11a, 11b Digital signal processing unit
12-1, 12-2 DAC
13 Clock generator
14 Analog multiplexer
111 Encoding/symbol mapping unit
112 Waveform shaping unit
113 Serial-parallel conversion unit
114-1 to 114-36 Convolution arithmetic operation unit
115-1, 115-6 Addition unit
116-1, 116-2 Parallel-serial conversion unit

The invention claimed is:

1. A signal generation device comprising:
a digital signal processor;
a plurality of digital-analog converters configured to respectively convert a plurality of digital signals output from the digital signal processor into analog signals; and
an analog multiplexer configured to interleave the analog signals respectively output from the plurality of digital-analog converters to generate a broadband signal,
wherein the digital signal processor includes a serial-parallel converter configured to divide an input signal into a number according to a ratio between a sampling frequency of the plurality of digital-analog converters and a clock frequency of the analog multiplexer in a time domain to generate a plurality of divided signals,
a plurality of convolution arithmetic operators configured to perform a convolution arithmetic operation for the plurality of divided signals generated by the serial-parallel converter, and
a plurality of adders configured to add the plurality of divided signals for which the convolution arithmetic operation has been performed by the plurality of convolution arithmetic operators to generate a plurality of digital signals corresponding to the respective digital-analog converters.

2. The signal generation device according to claim 1, wherein, in a case where the clock frequency for driving the analog multiplexer is ½ of a sampling frequency of the broadband signal, the plurality of convolution arithmetic operators is four convolution arithmetic operators, the plurality of adders is two adders, the serial-parallel converter divides the input signal into two pieces in the time domain to generate two divided signals, the four convolution arithmetic operators multiply one divided signal by a response function for every two convolution arithmetic operators included in the four convolution arithmetic operators, and the two adders add the plurality of divided signals for which the convolution arithmetic operation has been performed by the four convolution arithmetic operators to generate the plurality of digital signals corresponding to the respective digital-analog converters.

3. The signal generation device according to claim 1, wherein, in a case where the clock frequency for driving the analog multiplexer is ¼ of a sampling frequency of the broadband signal, the plurality of convolution arithmetic operators is sixteen convolution arithmetic operators, the plurality of adders is four adders, two parallel-serial converters configured to perform parallel-serial conversion for the plurality of divides output from the four adders are further included, the serial-parallel converter divides the input signal into four pieces in the time domain to generate four divided signals, the sixteen convolution arithmetic operators multiply one divided signal by a response function for every a four convolution arithmetic operators included in the four convolution arithmetic operators, the four adders add the plurality of divided signals for which the convolution arithmetic operation has been performed by the sixteen convolution arithmetic operators to generate the plurality of digital signals corresponding to the respective digital-analog converters, and each of the two parallel-serial converters performs parallel-serial conversion for the plurality of digital signals output from two adders included the four adders that are different from each other.

4. The signal generation device according to claim 1, wherein, in a case where the clock frequency for driving the analog multiplexer is ⅙ of a sampling frequency of the broadband signal, the plurality of convolution arithmetic operators is thirty-six convolution arithmetic operators, the plurality of adders is six adders, two parallel-serial converters that perform parallel-serial conversion for the plurality of digital signals output from the six adders are further included, the serial-parallel converter divides the input signal into six pieces in the time domain to generate six divided signals, the thirty-six convolution arithmetic operators multiply one divided signal by a response function for every six convolution arithmetic operators included in the thirty-six convolution arithmetic operators, the six adders add the plurality of divided signals for which the convolution arithmetic operation has been performed by the thirty-six convolution arithmetic operators to generate the plurality of digital signals corresponding to the respective digital-analog converters, and each of the two parallel-serial converters performs parallel-serial conversion for the plurality of digital signals output from three adders included in the six adders that are different from one another.

5. A signal generation method comprising:

by a digital signal processor, dividing an input signal into a number according to a ratio between a sampling frequency of a plurality of digital-analog converters and a clock frequency of an analog multiplexer in a time domain to generate a plurality of divided signals;

by the digital signal processor, performing a convolution arithmetic operation for the plurality of divided signals;

by the digital signal processor, adding the plurality of divided signals for which the convolution arithmetic operation has been performed to generate a plurality of digital signals corresponding to the respective digital-analog converters;

by the plurality of digital-analog converters, respectively converting the plurality of digital signals output from the digital signal processor into analog signals; and by the analog multiplexer, interleaving the analog signals respectively output from the plurality of digital-analog converters to generate a broadband signal.

6. A non-transitory storage medium that stores a program for making a computer perform processes, the processes comprising:

dividing an input signal into a number according to a ratio between a sampling frequency of a plurality of digital-analog converters and a clock frequency of an analog multiplexer in a time domain to generate a plurality of divided signals;

performing a convolution arithmetic operation for the plurality of divided signals;

adding the plurality of divided signals for which the convolution arithmetic operation has been performed to generate a plurality of digital signals corresponding to the respective digital-analog converters;

converting the plurality of digital signals into analog signals; and interleaving the analog signals to generate a broadband signal.

* * * * *